United States Patent [19]

Raccah et al.

[11] 3,962,715
[45] June 8, 1976

[54] HIGH-SPEED, HIGH-CURRENT SPIKE SUPPRESSOR AND METHOD FOR FABRICATING SAME

[75] Inventors: Paul M. Raccah, Hillside; Teodoro Halpern, Teaneck, both of N.J.; Soo Hee Shin, Bronx, N.Y.

[73] Assignee: Yeshiva University, New York, N.Y.

[22] Filed: Dec. 3, 1974

[21] Appl. No.: 529,222

[52] U.S. Cl. .................................. 357/2; 357/61; 427/87
[51] Int. Cl.² ........................................ H01L 45/00
[58] Field of Search ............. 357/2, 10, 61; 338/20, 338/21, 22 SD; 427/85, 87

[56] References Cited
UNITED STATES PATENTS

| | | | |
|---|---|---|---|
| 3,244,009 | 3/1966 | Dewald et al. | 357/2 |
| 3,358,192 | 12/1967 | Jensen | 357/2 |
| 3,543,196 | 11/1970 | Berglund | 357/2 |
| 3,629,155 | 12/1971 | Kristensen | 357/2 |
| 3,686,096 | 8/1972 | Hed et al. | 357/2 |
| 3,714,633 | 1/1973 | Epstein et al. | 357/2 |
| 3,731,249 | 5/1973 | Lipsicas et al. | 357/10 |
| 3,796,926 | 3/1974 | Cole et al. | 357/2 |
| 3,883,887 | 5/1975 | Robinson, Sr. | 357/2 |

Primary Examiner—William D. Larkins
Attorney, Agent, or Firm—Gottlieb, Rackman, Reisman & Kirsch

[57] ABSTRACT

There is disclosed a spike suppressor which is capable of switching very high currents at very high speeds. Typically, a current in the order of 80 amperes can be switched in less than 1 nanosecond. The device is also capable of dissipating high power. Typically, 80-ampere, 200-nanosecond pulses at a repetition rate of 10 per second can be tolerated. The device consists of a relatively thick layer (greater than 1 micron) of a refractory transition metal oxide such as $NbO_2$ grown on a conducting refractory substrate. The metal oxide is polycrystalline and can be grown in several different ways.

9 Claims, 4 Drawing Figures

HIGH-SPEED, HIGH-CURRENT SPIKE SUPPRESSOR AND METHOD FOR FABRICATING SAME

The invention herein described was made in the course of or under a contract or subcontract thereunder with the Department of the Army.

This invention relates to high-speed, high-current switching devices, typically used as spike suppressors, and more particularly to such devices made of refractory oxides of the transition metals such as niobium and titanium.

The switching speed and power handling capacity of any switching device depends on several factors. As a single example, the switching speed necessarily depends on the form of the electrodes employed because the switching speed is a function of the inherent capacitance of the electrodes. Thus it is difficult to distinguish switching devices solely in terms of their operating characteristics; widely differing types of switching devices can in fact have similar operating characteristics. But the switching device of our invention can be distinguished from the prior art in that no fabrication techniques have been known for producing a switching device which is capable of switching currents as high as 80 amperes in a time shorter than 0.5 nanosecond, the device also being capable of dissipating the power represented by 80-ampere, 200-nanosecond pulses at a repetition rate of 10 per second. Such devices can be made in accordance with the principles of our invention using state-of-the-art materials and methods of fabrication.

A spike suppressor is a two-terminal device which in actual use is placed across two lines and which serves to prevent the voltage across the lines from exceeding a predetermined value. When the threshold potential of the device is exceeded, its effective resistance decreases markedly. The potential to be protected against can be thought of as a source with some internal impedance (typically, the impedance of the line itself) and in the low-resistance state the switching device offers a resistance which is so much less than the effective internal impedance that the voltage across the line is held at a low value. But if the voltage which is to be protected against has a fast rise time, the switching device may not switch fast enough to protect the line. It is for this reason that high-speed spike suppressors are in great demand. And if very large currents from the source are to be shorted through the spike suppressor, the device must be capable of dissipating high power without damage.

It will be apparent that a spike suppressor is a form of "bistable resistor"; its normally high resistance can be switched to a much lower value when the voltage across it exceeds a threshold value, and the device restores to its high impedance state when the current flow through it falls below a sustaining level. Much of the prior art work has been described in terms of bistable resistors, but it is to be understood that as used herein this term is similar in meaning to that of spike suppressor. In general, the prior art has pertained to glassy semiconductor chalcogoenides and metal oxides. Our invention also involves the use of metal oxides. As a general rule, prior art metal oxide bistable resistors have been made by utilizing an amorphous layer of a material such as $Nb_2O_5$ about 1300 A thick across which a forming voltage is applied. This type of technique is described in U.S. Pat. Nos. 3,047,424; 3,336,514; 3,795,977, and 3,796,926. Also of interest are the following publications:

1. IBM Technical Disclosure Bulletin, Vol. 13, No. 5, Oct. 1970, page 1189.
2. Hiatt et al, "Bistable Switching in Niobium Oxide Diodes", Applied Physics Letters, Vol. 6, No. 6, Mar. 15, 1965, page 106.
3. T. Hickmott, "Electroluminescence and Conduction in $Nb-Nb_2O_5-Au$ Diodes", Journal of Applied Physics, Vol. 37, No. 12, November 1966, page 4380.
4. IBM Research, Feb. 10, 1972, RC 3728, J. F. Ziegler/M. Berkenblit et. al., "Nuclear Backscattering Analysis of $Nb-Nb_2O_5-Bi$ Structure".
5. K. C. Park and S. Basavaiah, "Bistable Switching in $Zr-ZrO_2-Au$ Junctions", Journal of Non-Crystalline Solids, Vol. 2, January 1970, pp. 284–291.
6. K. C. Park, M. Berkenblit, et. al., "Thermal Forming of Niobium Oxide Switchable Resistors", Journal of Electronic Materials, Vol. 2, Nov. 2, 1973.
7. D. J. Herrel and K. C. Park, "The Electrical Properties of Bistable Niobium Pentoxide Films", Journal of Non-Crystalline Solids 8–10 (1972), pp. 449–454.
8. S. Basavaiah and K. C. Park, "Bistable Switching and Conduction Mechanisms in $Nb-Nb_2O_5-Bi$ Junctions", IEEE Transactions on Electron Devices, Volume ED–20, No. 2, February 1973, pp. 149–157.

The use of an amorphous metal oxide, in which an active region is defined by a forming voltage, as generally described in the above references, results in a current-carrying capability usually no higher than the milliampere range. Such devices are not at all suitable for the suppression of high-power spikes.

Briefly, in accordance with the principles of our invention, a crystalline refractory transition metal oxide is grown on a compatible conducting refractory substrate. (The term refractory refers to the fact that the material does not melt at sustained temperatures in excess of 1,000° C.) The thickness of the oxide must exceed 1 micron. Although it is known that niobium and titanium serve the purpose, there may be other transition metals which can be used as well. To achieve high switching speeds, low capacitance state-of-the-art electrodes are employed.

The following theory is believed to explain, at least partially, the operation of the device. Refractory materials must be used in order that the device not melt as a result of the large currents which may flow through it. Similarly, the substrate on which the transition metal oxide crystal is grown must be compatible with the crystal, that is, its surface must be such that it permits the orderly growth on it of a metal oxide crystal. When a high enough voltage is applied across the crystalline layer, it undergoes a semiconductor to metallic transition. It is believed that the transition, which is reversible, takes the form of a filament which extends between the electrodes. The filament has a high conductivity with a diameter of the order of a micron, independent of the metal oxide thickness. The minimum thickness of 1 micron for the metal oxide layer is necessary in order to dissipate high power levels. The power dissipation is a function of the filament volume, and since the filament diameter is more or less constant, high-power devices can be made only if the metal oxide layer is thick enough.

Several methods will be described below for fabricating the devices of our invention. The methods are all state-of-the-art and they can be controlled in accordance with well-known practice. They do, however, require the use of a limited number of substrates. For example, to grow niobium oxide crystals, it is generally necessary to utilize a niobium substrate of some form. However, it is contemplated that other refractory substrates, such as zirconium or graphite, could be used if other fabrication techniques are employed, for example, if niobium oxide layers are formed by sputtering. In any event, devices constructed in accordance with the principles of our invention are clearly distinguished from those of the prior art in that they exhibit a crystalline refractory oxide of a transition metal whose thickness exceeds 1 micron.

Further objects, features and advantages of our invention will become apparent upon consideration of the following detailed description in conjunction with the drawing, in which.

Figure 1:
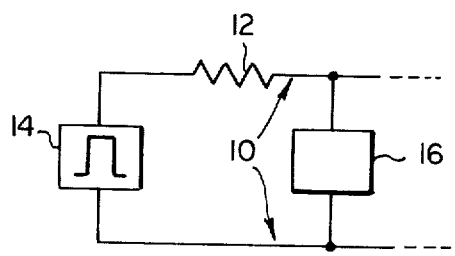
FIG. 1 depicts a typical application for a spike suppressor.

In FIG. 1, the two conductors 10 represent a line which is to be protected. Pulse generator 14 is symbolic only; it represents the source of a voltage spike. In the usual case the voltage spike is of short duration, e.g., under 100 nanoseconds, but its magnitude can be in the kilovolt range. The voltage spike is applied across the line through an effective impedance 12. Often, the effective impedance is determined primarily by the impedance of the line itself, and may be no more than perhaps 50 ohms.

The two-terminal spike suppressor 16 is connected across the line as shown in the drawing. In its normal (off) state, the device exhibits a very large impedance and for all practical purposes can be treated as an open circuit. But when the potential across the device exceeds a threshold level, it switches to a low impedance state to short circuit any current which flows as a result of the voltage spike. When the device is in its low-impedance state, the voltage across the line (across the device) is that fraction of the voltage spike determined by the relative magnitudes of source resistance 12 and the on-resistance of the spike suppressor. Since the source resistance is quite small in magnitude, it is apparent that for the spike suppressor to prevent large voltages from appearing across the line it must have a very low impedance when it turns on. For example, if a 3-kilovolt spike is to be protected against, and the maximum voltage across the line which can be tolerated is 300 volts, the impedance of the spike suppressor in the low-impedance state must not exceed 10% of the combined impedances (12 and 16). It is apparent that with such a low combined impedance and with such large voltage spikes, very large currents will flow through the spike suppressor. It is for this reason that an effective high-voltage spike suppressor must be capable of permitting large current flow through it.

Fortunately, the voltage spikes which are encountered in practice are relatively short in duration, e.g., they are usually under 100 nanoseconds in duration. Thus the average power which must be dissipated by the spike suppressor is low, although the power which must be dissipated while the voltage spike is actually applied may be very high. A typical device constructed in accordance with our invention may carry 80 amperes and may exhibit an average voltage drop in the low-impedance state of 80 volts. The power dissipated is thus 6400 watts — but only during the presence of the spike. Devices made in accordance with our invention have been tested under the rather extreme condition of 200-nanosecond pulses at a repetition rate of 10 per second. The average power dissipated by such a device during the overall test cycle is thus (2,000) (10–9) (6400) or only 12.8 milliwatts.

Quite apart from the power-handling capacity of the spike suppressor, for it to have the most practical use it must be capable of switching at high speeds. From a theoretical point of view, if the voltage spike is applied instantaneously across the line, since it takes some finite time for the spike suppressor to switch impedance states, until the device switches the full voltage spike appears across the line. As a practical matter, however, the fastest voltage spike encountered in practice has a rise time of at least several nanoseconds. If the switching time of the spike suppressor is well under the time taken for the voltage spike to reach its full magnitude, it is apparent that the spike suppressor will switch impedance states to short out the resulting large current before the full potential of the spike is even applied across the line. Devices constructed in accordance with the principles of our invention have exhibited switching times under 0.5 nanosecond; they are certainly fast enough to protect against the voltage spikes which are encountered in actual practice.

Figure 2:
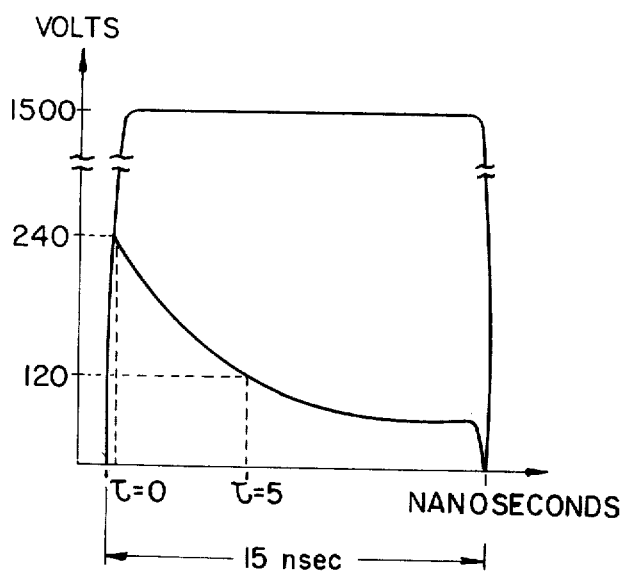
FIG. 2 depicts the operation of the spike suppressor of FIG. 1 when a high-voltage pulse is applied across it.

FIG. 2 is a plot which depicts the operation of a spike suppressor made in accordance with the principles of our invention when a high-voltage pulse is applied across it. The pulse itself (upper curve) is shown as having a peak magnitude of 1500 volts and a duration of 15 nanoseconds. The lower curve in FIG. 2 represents the voltage across the spike supressor. When the voltage across the device reaches 240 volts, it begins to switch state. Within 5 nanoseconds the voltage across the device (the line) has been limited to approximately 120 volts, and several nanoseconds later the steady-state voltage across the device is under 100 volts. This voltage remains across the device (line) until the termination of the voltage spike.

Figure 3:
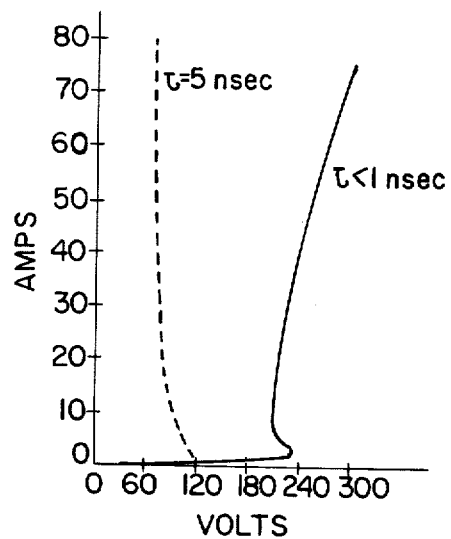
FIG. 3 is the current versus voltage characteristic for a device having a 3-micron thick $NbO_2$ crystalline layer grown on a cleaved single crystal NbO substrate.

A typical device of our invention consists of a 3-micron thick $NbO_2$ crystalline layer grown on a cleaved single crystal NbO substrate. At least one electrode is a state-of-the-art pressure electrode whose contact area is equal to the cross-sectional area of the wire contact itself so that the inherent capacitance of the electrodes is kept to a minimum. FIG. 3 depicts the current versus voltage characteristics of such a device. The solid curve represents the characteristic which is exhibited within 1 nanosecond of the application of a voltage spike across the device. When the device is turned on, its characteristic changes to that shown by the dashed curve, the dashed curve in the selected example depicting the device characteristic after 5 nanoseconds have elapsed. It is apparent from the plots of FIG. 3 that the switching time of the device is exceedingly short, and the steady-state voltage across the device in the low impedance state is less than 80 volts.

Devices have been constructed with niobium oxide and titanium oxide layers (e.g., $NbO_2$ and $Ti_3O_5$), although as mentioned above there may be oxides of other transition metals which perform satisfactorily. A preferred method of fabrication is to place a single crystal NbO chip, which serves as the substrate, and which has dimensions of 2 millimeters by 2 millimeters and a thickness of at least 0.5 millimeter, in a tube furnace with an internal diameter of 1.5 inches. The chip is held at a temperature of 1050° C in a $CO_2/H_2$ atmosphere. The proportion of hydrogen gas is very low. The partial oxygen pressure is selected to be in thermodynamic equilibrium with any composition in the $NbO_2$ phase domain. That is, the oxygen content of the surface of the chip (the crystalline layer which is grown) can be varied, depending upon the partial oxygen pressure, from that of $NbO_2$ in equilibrium with NbO (oxygen poor end of the domain of existence of $NbO_2$) to that of $NbO_2$ in equilibrium with $Nb_2O_5$ (oxygen rich end of the domain of existence of $NbO_2$). The computation of the proper $CO_2/H_2$ ratio can be determined in accordance with well-known procedures, for example, those explained in the text "Free Energy of Formation of Binary Compounds," Thomas B. Reed, M.I.T. Press, 1971. It is apparent that the longer the chip is exposed in the furnace, the thicker the surface layer of the NbO chip which is oxidized to $NbO_2$. The duration of exposure necessary for the formation of a 1-micron thick layer of $NbO_2$ is approximately 10 hours. A 5-micron thick layer can be obtained with an exposure of 50 hours.

We have also grown polycrystalline $NbO_2$ layers on a cleaved single-crystal NbO chip by placing the chip in an evacuated ampula in the presence of the stoichiometric amount of $Nb_2O_5$ necessary to provide the amount of oxygen to form the desired thickness of the $NbO_2$ layer. The temperature at which the crystal is grown, and the duration of the process, are the same as described above in connection with the growth of the crystal layer in a furnace through which a $CO_2/H_2$ gas mixture flows.

Similarly, rather than to use single-crystal NbO chips, it is also possible to grow $NbO_2$ crystal layers on niobium metal sheets, using the same methods described above. Typically, the metal sheets on which the crystals are grown are 0.1 millimeter thick and have side dimensions of 1 millimeter by 1 millimeter. A larger niobium metal sheet should first be cut into smaller squares, for example, by stamping them out, rather than to grow a crystal on the larger sheet and then to cut it. This is because an $NbO_2$ crystal layer on the larger sheet can be broken during a subsequent cutting process.

Figure 4:
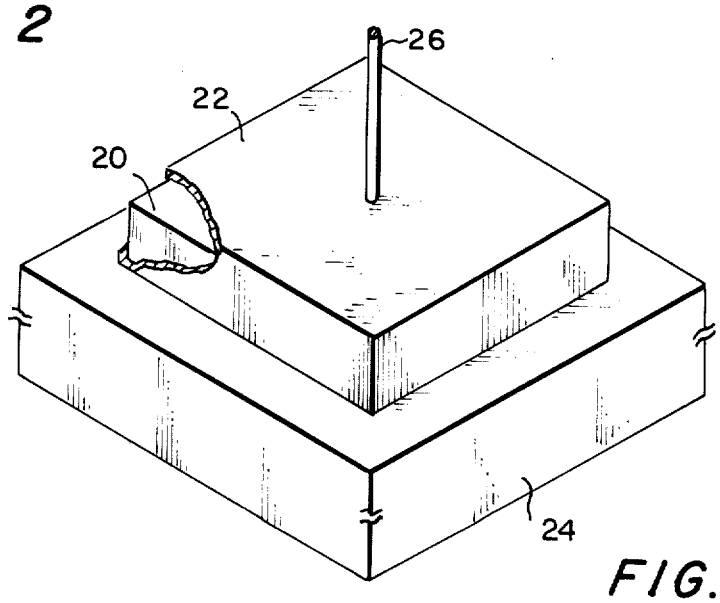
FIG. 4 depicts the form of a device made in accordance with the principles of our invention.

FIG. 4 depicts a switching device made in accordance with any one of the above procedures. The conducting refractory substrate 20 is shown as being completely enclosed by the metal oxide crystalline layer 22 (shown partially broken away). The layer is grown all around the substrate and there are thus actually two crystalline layers between the electrodes. One surface of the crystal-coated chip is bound with any conventional conducting epoxy (not shown) to a copper plate 24. A spring-loaded tungsten filament 26 of 4 mils diameter, shown only symbolically, is used to provide a conventional pressure contact on the other side of the chip. (The reason for not using two epoxy-secured copper plates, although such an arrangement could be used if fast switching time is not important, is that the inherent capacitance of the electrodes is a function of the minimum contact area of the two electrodes.)

It should be noted that the NbO chip, or niobium metal, substrate 20 is a very good metallic conductor. Consequently, the only parts of the overall device which are operative are those parts of the upper and lower crystal layers 22 which are in line with filament 26. The thickness of the substrate is of no moment. The power-handling capacity of the device is determined by the combined thicknesses of the two crystal layers between the contacts. (With a crystal layer thickness of 1 micron, the effective crystal thickness between the two electrodes is 2 microns.) The combined thickness must exceed 1 micron if the device is to afford protection against the normally encountered large voltage spikes, especially those in military environments. If the crystal is grown on only one side of the substrate, then the layer must be at least 1 micron thick.

Within the limits of 1–5 microns, the switching voltage of the device does not depend on the thickness of the crystal layer. The thickness of the crystal layer does, however, define the off-resistance of the device. Typically, the off-resistance of a device with a 1-micron thick crystal layer is approximately 10 kilohms. The off-resistance can be increased to 100 kilohms by increasing the thickness of the crystal layer to 10 microns.

The switching voltage of the device can be varied by doping the $NbO_2$ layer. In actual practice, this is achieved by utilizing a doped NbO substrate so that the dopant atoms appear in the layer which is grown on the substrate. The substrate itself, whether doped or undoped, can be made using conventional equipment such as a commercial Czochralsky puller. Chips which are cleaved from a doped substrate can be oxidized using any of the methods described above. Depending upon the degree of doping at an $NbO_2/NbO$ junction, for example, the threshold voltage can be varied over a wide range. Both titanium and vanadium dopants have been used in niobium oxide devices. The threshold voltage varies from 130 volts for 2 percent titanium doping to 20 volts for 11 percent titanium doping.

We have also grown $Ti_3O_5$ crystals on TiO substrates. The techniques for growing such crystals are essentially identical to those used for the growth of $NbO_2$ crystals. The only difference is that a TiO crystal does not cleave so that the chip substrate which must be used should be prepared by diamond sawing. A typical off-resistance for a 1-micron thick titanium device is 20 kilohms, and the device exhibits a threshold voltage of approximately 50 volts. The current-carrying capacity of the device is comparable to that of a niobium oxide device.

It should also be noted that the threshold voltage of any device made in accordance with the principles of our invention may be modified by changing the electrode capacitance. The typical capacitance when using a spring-loaded tungsten contact as described above is of the order of 0.1pF, but the capacitance can be made much larger by increasing the diameter of the tungsten electrode. Since the electrode capacitance affects both the switching voltage and switching time, it is apparent that trade-offs may be made depending upon the particular application intended for any device.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

What we claim is:

1. A spike suppressor comprising a pair of electrodes, a conducting refractory substrate of single-crystal NbO, and at least one layer of refractory crystalline $NbO_2$ on said substrate, said substrate and at least one crystalline layer of $NbO_2$ being secured between said pair of electrodes, and said at least one crystalline layer having a total thickness of at least 1 micron.

2. A spike suppressor in accordance with claim 1 wherein at least one of said electrodes is a filament pressure contact.

3. A spike suppressor comprising a pair of electrodes, a conducting refractory substrate of single-crystal TiO, and at least one layer of refractory crystalline $Ti_3O_5$ on said substrate, said substrate and at least one crystalline layer of $Ti_3O_5$ being secured between said pair of electrodes, and said at least one crystalline layer having a total thickness of at least 1 micron.

4. A spike suppressor in accordance with claim 3 wherein at least one of said electrodes is a filament pressure contact.

5. The method of making a spike suppressor comprising the steps of establishing a conducting refractory substrate of NbO, growing on said substrate a refractory crystalline layer of $NbO_2$, and forming a pair of electrodes across said substrate and crystalline layer, said refractory crystalline layer being grown to an extent such that the thickness of the $NbO_2$ between said pair of electrodes exceeds 1 micron.

6. The method of making a spike suppressor in accordance with claim 5 wherein the NbO substrate is doped with titanium or vanadium in an amount which results in a desired threshold voltage for the spike suppressor following the growth of said crystalline layer.

7. The method of making a spike suppressor in accordance with claim 6 wherein at least one of the electrodes which is formed is a filament pressure contact.

8. The method of making a spike suppressor comprising the steps of establishing a conducting refractory substrate of single-crystal TiO, growing on said substrate a refractory crystalline layer of $Ti_3O_5$, and forming a pair of electrodes across said substrate and crystalline layer, said refractory crystalline layer being grown to an extent such that the thickness of the $Ti_3O_5$ between said pair of electrodes exceeds 1 micron.

9. The method of making a spike suppressor in accordance with claim 8 wherein at least one of the electrodes which is formed is a filament pressure contact.

* * * * *